(12) United States Patent
Moriya

(10) Patent No.: US 6,683,329 B2
(45) Date of Patent: Jan. 27, 2004

(54) SEMICONDUCTOR DEVICE WITH SLOT ABOVE GUARD RING

(75) Inventor: Fumihiro Moriya, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/084,511

(22) Filed: Feb. 28, 2002

(65) Prior Publication Data

US 2003/0160261 A1 Aug. 28, 2003

(51) Int. Cl.[7] .................. H01L 29/74; H01L 31/111
(52) U.S. Cl. .................................. 257/127; 257/181
(58) Field of Search ................................. 257/127, 181

(56) References Cited

U.S. PATENT DOCUMENTS 5,444,186 A * 8/1995 Eguchi ...................... 174/250
5,475,243 A * 12/1995 Saito ......................... 257/171
5,861,656 A * 1/1999 Keri .......................... 257/491

FOREIGN PATENT DOCUMENTS

| JP | 10172927 A | 6/1998 |
| JP | 200114430 A | 4/2000 |

* cited by examiner

*Primary Examiner*—Eddie Lee
*Assistant Examiner*—Joseph Nguyen
(74) *Attorney, Agent, or Firm*—Volentine Francos, PLLC

(57) ABSTRACT

A semiconductor device includes an electronic circuit, a metal guard ring surrounding the electronic circuit, and a passivation layer covering the electronic circuit and guard ring. The passivation layer has a slot extending from the surface of the device down to the guard ring. The slot prevents cracks that may form in the passivation layer at the edges of the device from propagating to the area inside the guard ring. Locating the slot over the guard ring enables the size of the device to be reduced, and enables the guard ring to keep moisture and contaminants that enter the slot from reaching lower layers of the device.

9 Claims, 2 Drawing Sheets

SEMICONDUCTOR DEVICE WITH SLOT ABOVE GUARD RING

BACKGROUND OF THE INVENTION

1. Field of the Invention

The present invention relates to a semiconductor device, more particularly to an improved method of protecting a semiconductor device from the intrusion of moisture and contaminants through cracks.

2. Description of the Related Art

A plurality of semiconductor devices such as integrated circuits are commonly formed simultaneously on a semiconductor wafer, then separated into individual devices or 'chips.' Various measures are taken to protect the circuitry in the chips from damage by moisture and ionic contamination. The surfaces of the chips are generally protected by the deposition of an uppermost passivation layer. The edges of the chips are protected by the formation of a metal guard ring just inside the perimeter of each chip.

A problem with these protective measures is that the scribing or dicing process used to separate a wafer into chips can cause cracks in the edges of the passivation layer and other underlying layers. Such cracks may also arise from mechanical shock, caused by contact between two chips, for example. Once formed, such cracks have a tendency to propagate. If they reach the area inside the guard ring, moisture and contaminants infiltrating through the cracks can affect the chip circuitry, causing such problems as alteration of transistor characteristics, corrosion of metal interconnection wiring, and open circuits.

For this reason, it is a conventional practice to leave a margin of space between the chip circuitry and the edge of the chip, the margin being sufficiently wide that cracks propagating from the edges of the chip will usually stop short of the circuit area. It is also a conventional practice to inspect the chips for cracks after they have been separated from the wafer, and to reject chips that have cracks exceeding a certain size. The inspection is carried out visually, however, so it is time-consuming and expensive. It is also unreliable, because it is impractical to inspect all chips, and even in the chips that are inspected, it is difficult to detect all cracks exceeding the allowable size. Moreover, an innocuously small crack may propagate to a fatal size after the inspection process, when the chip is being sealed in resin inside its package. Contamination through cracks thus remains a significant cause of device failure.

Increased protection could be obtained by increasing the width of the unused margin at the chip edges, but this is not desirable. As advances in chip fabrication technology have made it possible to reduce the area occupied by the chip circuitry, in order to achieve a corresponding reduction in chip size, there is a need to decrease the width of the margin, rather than to increase this width.

A known method of preventing crack propagation is to form a slot in the passivation layer and the underlying inter-layer dielectric films, the slot being located between the guard ring and the edges of the chip, as disclosed, for example, in Japanese Laid Open Patent Publication No. 10-172927. This slot, however, has several disadvantages: it occupies further space in the margin outside the guard ring, thereby hindering the overall reduction of chip size; it provides a route by which moisture can reach the chip substrate; and metal plug material deposited in the slot during metalization steps in the fabrication process may come loose during or after the fabrication process and contaminate the semiconductor device, or other semiconductor devices, or equipment used to make and test these devices.

SUMMARY OF THE INVENTION

An object of the present invention is to provide a semiconductor device with improved protection from moisture and contaminants without increasing the size of the device.

Another object of the invention is to prevent contamination of the semiconductor device and its manufacturing equipment by loose metal material.

A semiconductor device according to the present invention is formed on a semiconductor chip. The device has a circuit area surrounded by a metal guard ring, and is covered by a passivation layer. The passivation layer has a slot formed above the guard ring, extending from the surface of the device down to the guard ring, surrounding the circuit area. The slot is preferably narrower than the guard ring and leaves the edges of the guard ring covered by the passivation layer.

The invention also provides a method of manufacturing a semiconductor device, including:

(a) forming an electronic circuit with metal interconnection wiring and a metal guard ring on a semiconductor chip;

(b) covering the electronic circuit and guard ring with a passivation layer; and (c) forming a slot in the passivation layer above the guard ring.

Step (c) preferably includes the simultaneous formation of openings in the passivation layer for bonding pads.

In the invented semiconductor device, the slot prevents cracks in the passivation layer from propagating past the guard ring, thereby leaving the passivation layer able to protect the circuit area from moisture and contaminants. The guard ring prevents moisture and contaminants that enter the slot from reaching lower layers of the device. The size of the device can be reduced because the slot is disposed above the guard ring, instead of being disposed in the space between the guard ring and the edges of the device.

In the invented method of manufacturing a semiconductor device, no metal is deposited in the slot in the passivation layer, because the slot is formed after the guard ring and metal interconnection wiring. Accordingly, no metal material can come loose from the slot and contaminate the device or its manufacturing and testing equipment.

DETAILED DESCRIPTION OF THE INVENTION

Figure 1:
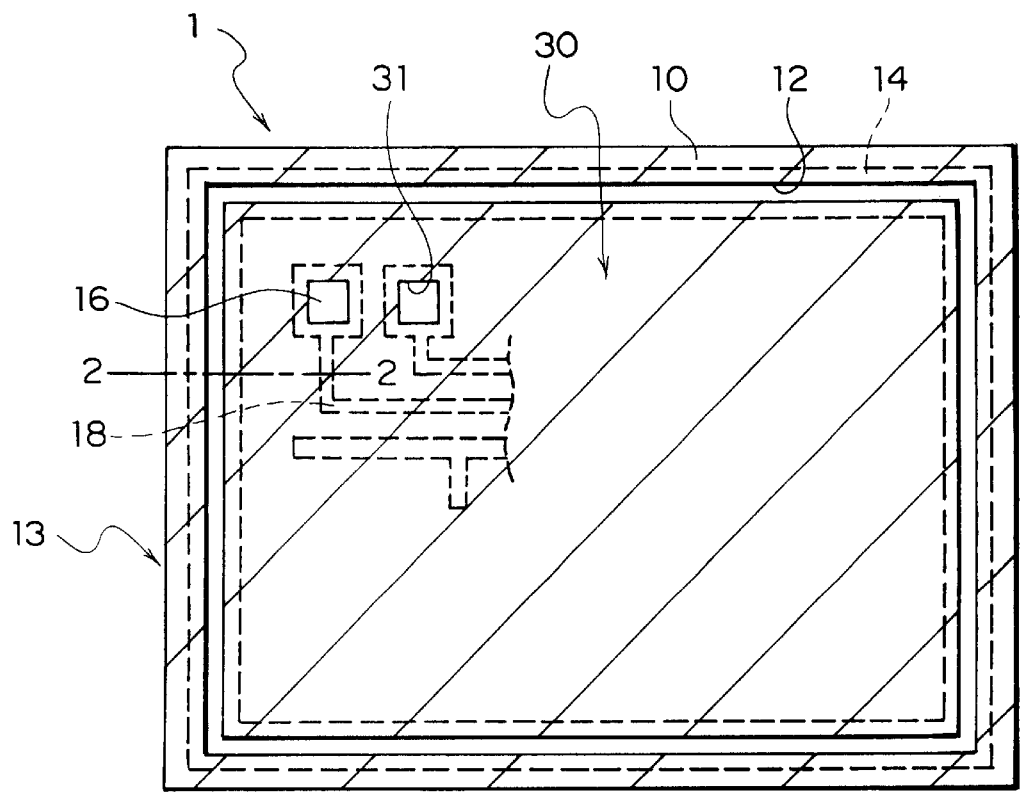
FIG. 1 is a top plan view of a semiconductor device embodying the invention.

Embodiments of the invention will be described with reference to the attached drawings, in which like parts are indicated by like reference characters.

Figure 2:
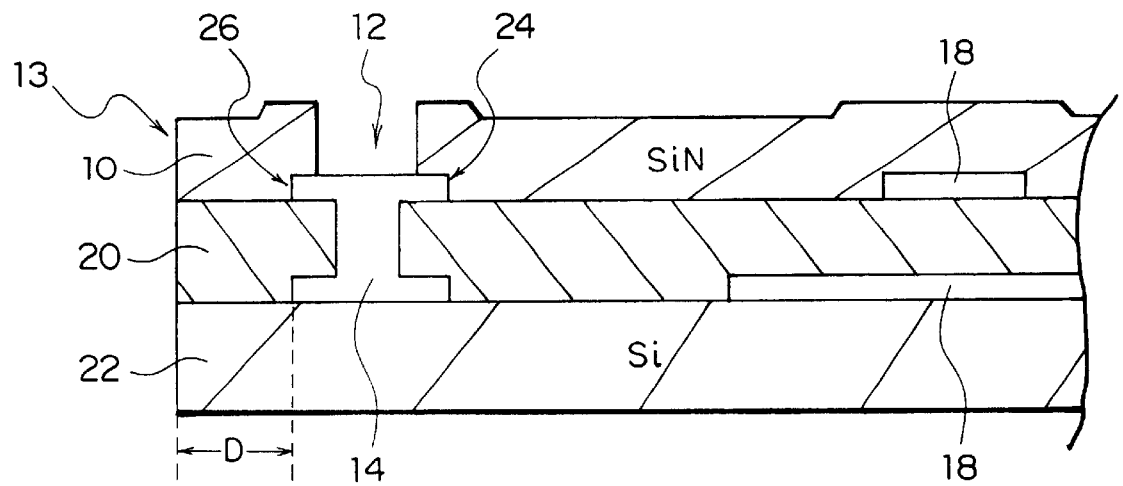
FIG. 2 is a sectional view through line 2—2 in FIG. 1.

The first embodiment, illustrated in FIGS. 1 and 2, is a semiconductor device 1 formed on a semiconductor chip covered by a passivation layer 10 having a slot 12. The slot 12 closely parallels all four sides of the semiconductor device 1 and is typically disposed about fifty to two hundred micrometers (50 μm to 200 μm) from the edges 13 of the semiconductor chip. The slot 12 is disposed above a metal guard ring 14 that also parallels the edges 13 of the chip. The guard ring 14 surrounds a circuit area 30 that includes metal bonding pads 16, metal interconnection wiring 18, and other electronic circuit elements (not visible). The guard ring 14 is not part of the circuit itself, although it may be grounded for electrical noise reduction. The guard ring is typically separated from the electronic circuit elements by a distance of at least one micrometer (1 μm).

The metal interconnection wiring 18 may occupy multiple layers in the semiconductor device 1. FIG. 2 shows two layers of metal interconnection wiring 18 mutually isolated by an inter-layer dielectric film 20. The guard ring 14 is formed in both metal layers and extends through the inter-layer dielectric film 20, down to the chip substrate 22, so that the metal interconnection wiring 18 and other electronic circuit elements are surrounded by a continuous ring of metal. The passivation layer 10 in FIG. 2 is a single layer of silicon nitride (SiN). The substrate 22 comprises crystalline silicon (Si), and the inter-layer dielectric film 20 comprises any of various well-known dielectric materials, such as silicon dioxide.

The invention is not restricted to the structure shown in FIG. 2. The passivation layer 10 may be made of a dielectric material other than silicon nitride, such as silicon oxide (SiO) or silicon oxynitride (SiON), or may have a multilayer structure including, for example, both a silicon nitride layer and a silicon oxide layer. The number of metal wiring layers may differ from two. The substrate material is not restricted to silicon but may comprise another semiconductor material.

As shown in FIG. 2, the slot 12 in the passivation layer 10 extends from the surface of the passivation layer down to the surface of the guard ring 14. The slot 12 is narrower than the guard ring 14, so the inside edge 24 and outside edge 26 of the guard ring are left covered by the passivation layer 10. The guard ring 14 accordingly acts as a barrier that prevents moisture and other contaminants that may enter the slot 12 from reaching the layers below the passivation layer 10, in this case the inter-layer dielectric film 20 and substrate 22.

The effect of the slot 12 is to halt the propagation of cracks that may form in the passivation layer 10 at the edge 13 of the chip. Cracks in the part of the passivation layer 10 disposed outside the guard ring 14 are stopped at the slot 12 and do not propagate to the part of the passivation layer 10 disposed inward of the guard ring. Accordingly, even if cracks are created by mechanical stress at the edge 13 of the chip, the passivation layer 10 continues to protect the circuit area 30 (FIG. 1) from the intrusion of moisture and ionic contaminants.

A consequent effect is that the width of the unused chip area outside the guard ring 14, shown as the dimension D in FIG. 2, can be reduced as compared with the prior art. Dimension D does not have to be larger than the expected crack propagation length, and in particular, dimension D does not have to be large enough to accommodate a slot disposed outside the guard ring 14. Accordingly, the total size of the semiconductor device 1 can be reduced, as compared with the prior art in which a slot was formed outside the guard ring 14; both the chip width and chip length can be reduced. The cost of the semiconductor device 1 may therefore be reducible, if the size reduction enables more semiconductor devices to be formed on a single wafer.

Alternatively, for a given chip size, the guard ring 14 can be brought closer to the edge 13 of the chip, leaving room for more electronic circuit elements.

The visual inspection process is furthermore simplified, in that the inspector does not have to judge crack length, but only has to verify that there are no cracks in the part of the passivation layer 10 disposed inward of the slot 12. The reason is that cracks limited to the area outside the guard ring 14 do not affect the electronic circuits in the circuit area 30. Since the inspector can see the slot 12, verification that there are no cracks extending over the circuit area 30 is easy.

When the semiconductor device is manufactured, first an electronic circuit, including all the metal interconnection wiring 18 and the metal bonding pads 16, is formed on a semiconductor wafer. The guard ring 14 is also formed during this well-known circuit formation process. Next, the passivation layer 10 is deposited, covering the entire wafer surface, including the guard ring 14, bonding pads 16, and interconnection wiring 18. Finally, the passivation layer 10 is patterned by photolithography and etching to form the slot 12 over the guard ring 14, and simultaneously to form openings 31 above the bonding pads 16 for the connection of bonding wires (not shown) to the bonding pads.

Since the slot 12 is formed together with the openings 31 for the bonding pads, the invention can be practiced without additional fabrication steps, and the slot 12 does not add to the fabrication cost.

Since the slot 12 is formed after all metalization steps have been completed, no metal is deposited in the slot 12, and there is accordingly no risk that metal material left in the slot 12 might come loose and contaminate the surface of the wafer, or contaminate wafer fabrication and test equipment, or contaminate other surfaces and equipment after the semiconductor device 1 is separated from the wafer.

Figure 3:
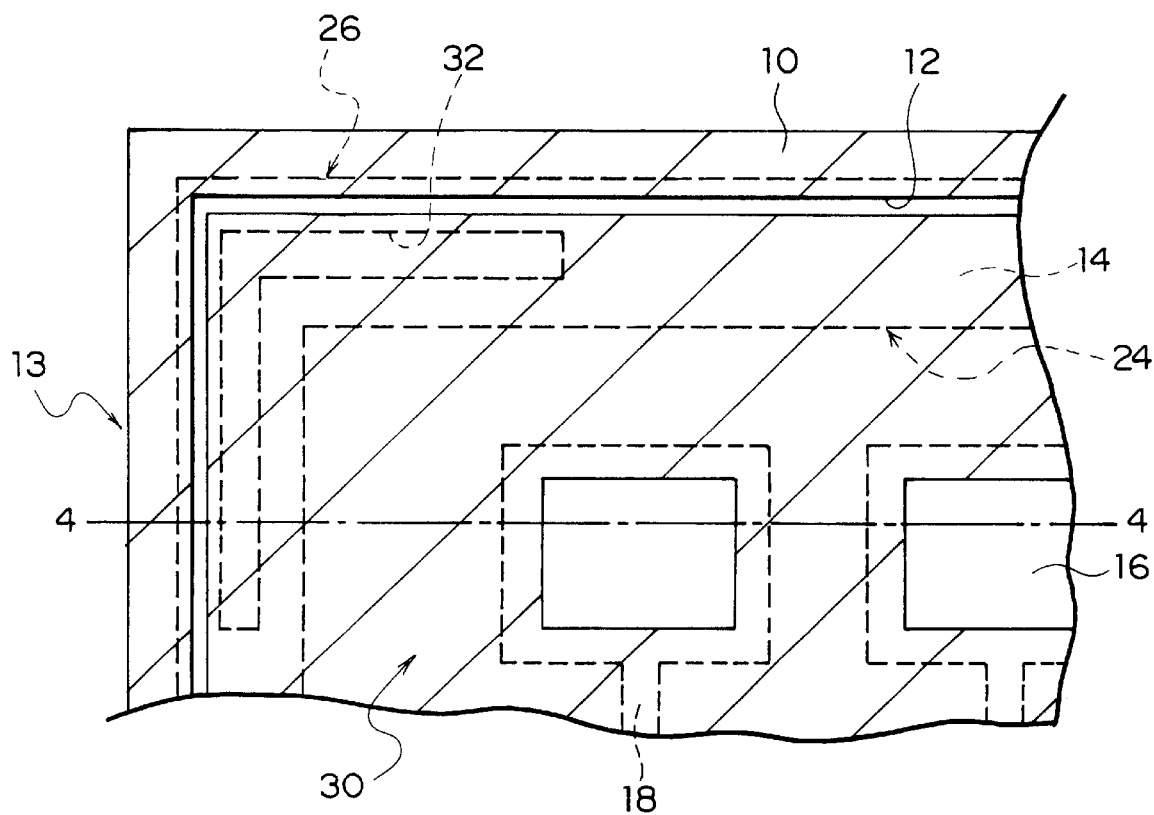
FIG. 3 is a partial top plan view of another semiconductor device embodying the invention.
Figure 4:
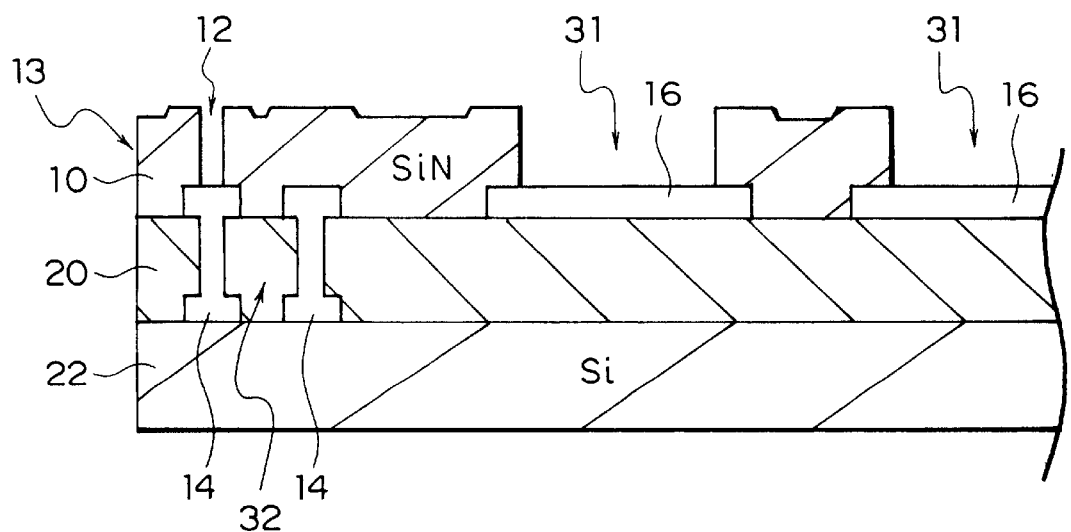
FIG. 4 is a sectional view through line 4—4 in FIG. 3.

In a second embodiment of the invention, illustrated in FIGS. 3 and 4, the guard ring 14 includes an internal slit 32 formed at each corner of the chip to relieve stress. The slot 12 in the passivation layer 10 is located over the part of the guard ring 14 disposed between the slit 32 and the outer edge 26 of the guard ring. The slot 12 is narrower than this part of the guard ring 14, so that both the outer edge 26 of the guard ring and the slit 32 are left covered by the passivation layer 10. The inner part of the guard ring 14, between the slit 32 and the inside edge 24 of the guard ring, is fully covered by the passivation layer 10, so that the circuit area 30 disposed inside the guard ring is well protected from moisture and contaminants.

The slot 12 in this second embodiment provides substantially the same effect as in the first embodiment, halting the propagation of cracks before they reach the circuit area 30 inside the guard ring 14, and enabling the overall size of the semiconductor device to be reduced.

The second embodiment can be fabricated by substantially the same process as the first embodiment, the slot 12 being formed at the same time as the openings 31 for the bonding pads 16, which are shown in FIG. 4. Since the slot 12 must be accurately aligned in the comparatively narrow space between the outer edge 26 of the guard ring 14 and the slit 32, however, higher alignment accuracy is required in the photolithography step that creates the slot 12 and the openings 31 for the bonding pads 16 than in the first embodiment.

In a variation of the second embodiment, the slot 12 is disposed above the part of the guard ring 14 between the slit 32 and the inside edge 24 of the guard ring.

In another variation, the slit 32 in the guard ring 14 is not confined to the corners of the chip, but extends for the full length of the guard ring, so that the guard ring has the form of a pair of concentric rings. The slot 12 is disposed over one of the two rings.

Those skilled in the art will recognize that further variations are possible within the scope of the invention as claimed below.

What is claimed is:

1. A semiconductor device formed on a semiconductor chip, comprising:

a circuit area including an electronic circuit disposed on a surface of the semiconductor chip;

a metal guard ring disposed on said surface of the semiconductor chip, surrounding the circuit area, the metal guard ring having an inside edge, an outside edge, and a slit disposed between the inside edge and the outside edge; and a passivation layer covering said surface of the semiconductor chip, the passivation layer having a slot disposed above the metal guard ring, the slot extending down to the metal guard ring and surrounding the circuit area, the slot being located away from the slit, so that the slit is covered by the passivation layer.

2. The semiconductor device of claim 1, wherein the slot is narrower than the metal guard ring, and the inside edge and the outside edge of the metal guard ring are covered by the passivation layer.

3. The semiconductor device of claim 2, wherein:

the semiconductor chip has a corner; and the slit in the metal guard ring is disposed at least at said corner.

4. The semiconductor device of claim 2, wherein the slot in the passivation layer is disposed between the slit and the outside edge of the metal guard ring.

5. A method of manufacturing a semiconductor device, comprising:

forming an electronic circuit on a surface of a semiconductor chip, and forming a metal guard ring surrounding the electronic circuit on said surface of the semiconductor chip, the metal guard ring having an inside edge, an outside edge, and a slit disposed between the inside edge and the outside edge;

covering said surface of the semiconductor chip, including the electronic circuit and the metal guard ring, with a passivation layer; and forming a slot in the passivation layer above the metal guard ring, the slot extending down to the metal guard ring and surrounding the electronic circuit, the slot being located away from the slit, so that the slit is covered by the passivation layer.

6. The method of claim 5, wherein:

the forming of said electronic circuit includes forming a metal pad within the electronic circuit; and the forming of said slot includes simultaneously forming an opening in the passivation layer above the metal pad, for connection of a bonding wire to the metal pad.

7. The method of claim 5, wherein the slot is narrower than the metal guard ring, and the inside edge and the outside edge of the metal guard ring are covered by the passivation layer.

8. The method of claim 7, wherein:

the semiconductor chip has a corner; and the slit in the metal guard ring is disposed at least at said corner.

9. The method of claim 7, wherein the slot in the passivation layer is disposed between the slit and the outside edge of the metal guard ring.

* * * * *